United States Patent [19]

Jinbo

[11] Patent Number: 4,868,788
[45] Date of Patent: Sep. 19, 1989

[54] SEMICONDUCTOR MEMORY DEVICE WITH IMPROVED WORD LINE DRIVE CIRCUIT

[75] Inventor: Toshikatsu Jinbo, Tokyo, Japan

[73] Assignee: NEC Corporation, Tokyo, Japan

[21] Appl. No.: 214,070

[22] Filed: Jul. 1, 1988

[30] Foreign Application Priority Data

Jul. 1, 1987 [JP] Japan .................................. 62-165663

[51] Int. Cl.⁴ .............................................. G11C 7/00
[52] U.S. Cl. ................................ 365/189.06; 365/185
[58] Field of Search .......................... 365/189, 185, 230

[56] References Cited

U.S. PATENT DOCUMENTS 4,807,195  2/1989  Busch et al. ........................ 365/207

Primary Examiner—James W. Moffitt
Attorney, Agent, or Firm—Sughrue, Mion, Zinn, Macpeak & Seas

[57] ABSTRACT

A semiconductor memory device provided with an improved word line drive circuit is disclosed. The memory device comprises a pair of decoding units, a plurality of word lines, a plurality of N-channel transistors coupled between first ends of the word lines and the output terminal of one of the pair of decoding unit, and a plurality of P-channel transistors coupled between second, opposite ends of the word lines and the output terminal of the other of the pair of decoding units.

8 Claims, 3 Drawing Sheets

SEMICONDUCTOR MEMORY DEVICE WITH IMPROVED WORD LINE DRIVE CIRCUIT

BACKGROUND OF THE INVENTION

The present invention relates to a semiconductor memory device fabricated on a semiconductor substrate and more particularly to a word line drive circuit thereof for selectively driving word lines.

Semiconductor memories are formed by arranging a large number of memory cells in a matrix form of rows and columns and memory cells are coupled to word lines arranged in rows and digit lines in columns. A read operation is performed by selecting one of the word lines The memory cells coupled to the selected word line produce read-out signals on the respective digit lines. While, in a write operation, one of the word lines is selected and the memory cells coupled to the selected memory cells are enabled to take therein the levels of the respective digit lines to which write data signals are applied.

In a recent tendency, the number of memory cells, that is memory capacity, is remarkably increased, and 256 k-bit and 1 M-bit memory devices are now commercially available Accompanied by the increase in the memory capacity, the number of word lines is greatly increased and the number of address signals for selecting each word line is also increased. Therefore, the number of transistors of each decoding unit for each word line is thus increased and hence it has become difficult to arrange each decoding unit with a minimum pitch of the word lines. Under such circumstance, it has been proposed such technique that a plurality of word lines are classified into a plurality of word line groups and a first decoder for selecting one of the word lines groups and a second decoder for selecting one of the word lines of the selected word line group are employed. According to the above technique, a transfer gate field effect transistor is coupled between each word line and the relevant output of the first decoder for selectively transferring the output of the first decoder to the relevant word line under control of the second decoder.

However, as is well known in the art, the potential applied to the selected word line is lower than the potential of a power voltage (Vcc) by a threshold voltage (Vth) of the transfer gate transistor.

Therefore, it is difficult to raise the potential of the selected word line to the power voltage Vcc for high speed operation and maximum utilization of the power voltage.

Moreover, the capacitances of the respective word lines are also increased in proportion to the increase in the memory capacity, so that a time constant of the word line is increased in its longitudinal direction, causing low speed driving of the word line.

SUMMARY OF THE INVENTION

It is an object of the present invention to provide a semiconductor memory device provided with an improved word line drive circuit which can drive a selected word line at a high speed.

The semiconductor memory device according to the present invention comprises at least one group of word lines arranged in parallel, memory cells coupled to the word lines, at least one pair of decoding units generating the same logic level of output signals simultaneously, a plurality of first field effect transistors of N-channel type coupled between one ends of the word lines of the same group and the output terminal of one of the pair of decoding units, and a plurality of second field effect transistors of P-channel type coupled between second, opposite ends of the word lines of the same group and the output terminal of the other of the pair of decoding units. The plurality of first and second transistors are controlled in such manner that one of the first transistors and one of the second transistors associated with the same word line coupled to the above one first transistor are made simultaneously conductive to allow the output signals of the pair of decoding units to be applied to the word line via the conductive one first transistor and the conductive one second transistor.

According to the present invention, the word line to be selected is driven at its both ends via the N-channel transistor and the P-channel transistor simultaneously. Therefore, the word line can be rapidly raised to the power voltage without level reduction upon selection, and rapidly changed from the selected state to the non-selected state to reach the reference voltage.

Thus, the word line can be driven with full swing of the power supply voltage range at a high speed.

DETAILED DESCRIPTION OF THE INVENTION

Figure 1:
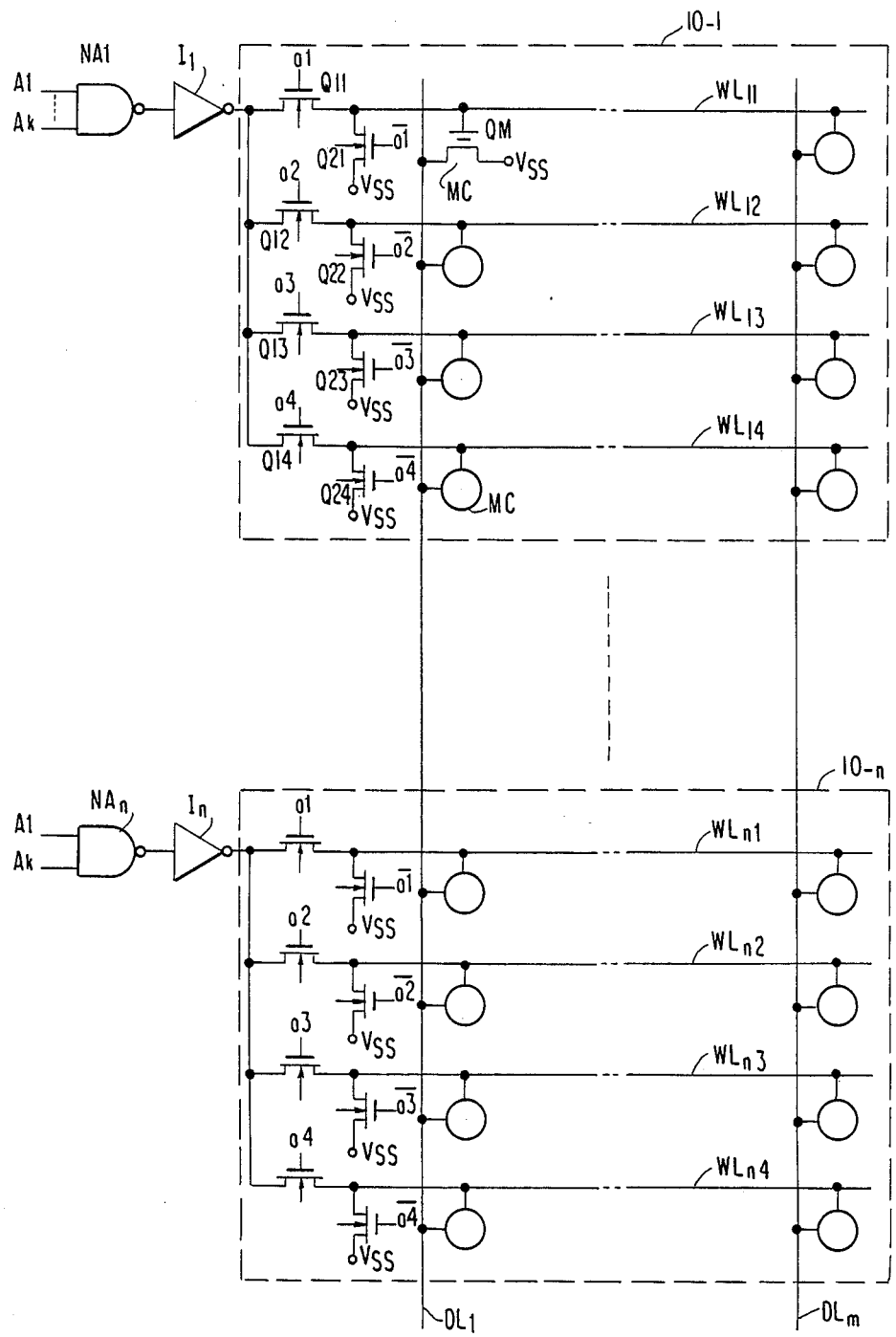
FIG. 1 is a schematic block diagram showing a memory device according to a prior art.

Referring to FIG. 1, a semiconductor memory device according to a prior art will be explained.

A plurality of word lines $WL_{11}$–$WL_{n4}$ are arranged in rows and every four adjacent word lines are classified into "n" word line groups 10-1 to 10-n. A plurality of digit lines $DL_l$–$DL_m$ are arranged in columns. A plurality of memory cells MC each composed of a known floating gate field effect transistor $Q_M$ are provided with connection to the word lines and the digit lines.

NAND gates $NA_l$–$NA_n$ receiving combinations true and complementary row address signals $A_l(\overline{A_l})$–$A_k(\overline{A_k})$ are provided in association with the word line groups 10-1 to 10-n, respectively, and a selected one of the NAND gates produces a "0" level out signal while other remaining NAND gates produce a "1" level output. The outputs of the NAND gates $NA_l$–$NA_n$ are applied to inputs of inverters $I_l$–$I_n$. Between the output of the inverter $I_l$ and the four word lines $WL_{11}$–$WL_{14}$, transfer gates transistors $Q_{11}$–$Q_{14}$ of an N-channel type are connected while N-channel transistors $Q_{21}$–$Q_{24}$ are connected between the word lines $WL_{11}$–$WL_{14}$ and a reference voltage Vss such as a ground potential.

Selection signals $a_1$–$a_4$ are applied to gates of the transistors and their complementary signals $\overline{a_1}$–$\overline{a_4}$ are applied to gates of the transistors $Q_{21}$–$Q_{24}$, as illustrated. The signals $a_1$–$a_4$ and $\overline{a_1}$–$\overline{a_4}$ are such signals that are generated by decoding 2-bits of row address signals other than $A_l$–$A_k$ in a known way.

When the word line $WL_{11}$ is to be selected, the output of $NA_l$ is at a "0" (low) level and therefore the output of the inverter $I_l$ is at a "1" (high) level. Also, the signals $a_1$ and $\overline{a_1}$ are at "1" and "0" levels, respectively with $a_2$–$a_4$ at a "0" level and $\overline{a_2}$–$\overline{a_4}$ at a "1" level. Thus, the transistor $Q_{11}$ is rendered conductive to transmit the "1" level output of the inverter $I_l$ to the word line $WL_{11}$. While in this instance, the transistors $Q_{12}$–$Q_{14}$ are non-conducting and the transistors $Q_{22}$–$Q_{24}$ are conducting so that the word lines $WL_{12}$–$WL_{14}$ are nonselected but clamped to Vss.

In the memory circuit of FIG. 1, the "1" level output of the inverter $I_1$ is usually the Vcc level and the "1" level of the signal $a_l$ is also the Vcc level so that the level of the selected word line $WL_{11}$ is at the level of (Vcc−Vth) (Vth being a threshold voltage of the transistors $Q_{11}$). Therefore, it is impossible to apply the power voltage Vcc to the selected word line via the transfer gate transistor $Q_{11}$. For example, in case of Vcc=5 V, Vth=0.8V, the selected word line is driven only to 4.2 V, resulting in low utilization efficiency of the power voltage.

Moreover, the word lines have time constant in their length and the far end of the selected word line needs some delay time for being driven to the selected level (Vcc−Vth).

Figure 2:
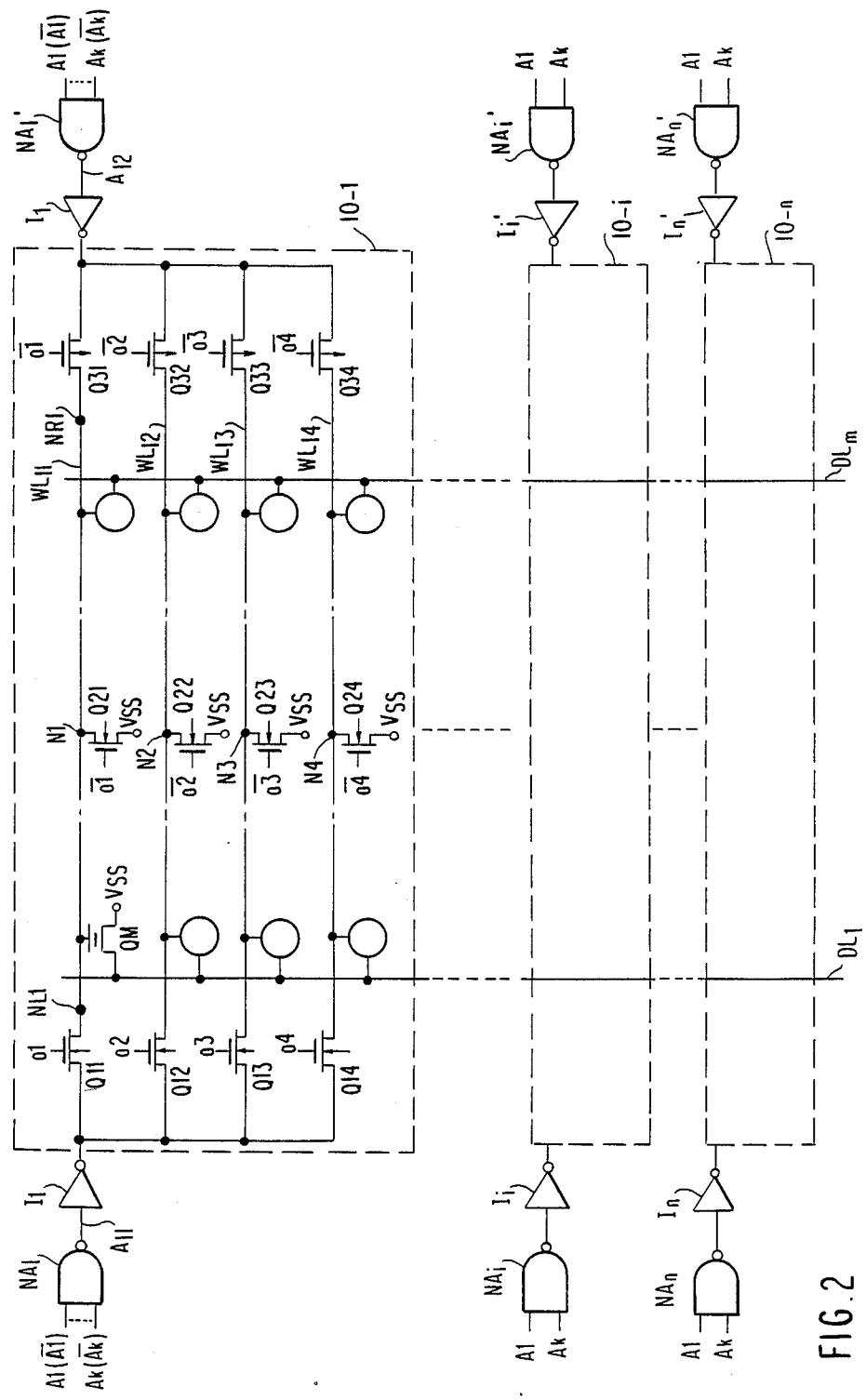
FIG. 2 is a schematic block diagram showing a major part of a semiconductor memory device according to one embodiment of the invention.

Referring to FIG. 2, a semiconductor memory according to a preferred embodiment of the invention will be explained.

In FIG. 2, the portions or elements corresponding to those in FIG. 1 are denoted by the same reference codes.

The NAND gates $NA_l$–$NA_h$ and the inverters $I_l$–$I_n$ are arranged on a left side of the word line groups 10-1 to 10-n similarly to the memory of FIG. 1: NAND gates $NA_l'$ to $NA_n'$ and inverters $I_l'$ to $I_n'$ are provided on a right side of the word line groups 10-1 to 10-n, respectively.

The right-side NAND gates $NA_l'$ to $NA_n'$ correspond to the left-side NAND gates $NA_l$ to $NA_n$ in function, respectively. Namely, each one of the left-side NAND gates, e.g. $NA_l$ and one of the right-side NAND gates associated with the same word line group e.g. 10-1 receive the same combination of row address signals and produce the same state of output signals.

In the group 10-1, N-channel type field effect transistors $Q_{11}$ to $Q_{14}$ are coupled between the output of the left-side inverter $I_l$ and the left ends of the word lines $WL_{11}$ to $WL_{14}$. The transistors $Q_{11}$–$Q_{14}$ are controlled by the selection signals $a_l$–$a_4$.

While between the output of the right-side inverter $I_l'$ and the right ends of the word lines $WL_{11}$ to $WL_{14}$, P-channel field effect transistors $Q_{31}$ to $Q_{34}$ are coupled, respectively. The P-channel transistors $Q_{31}$ to $Q_{34}$ are controlled by the selection signals $\overline{a_l}$ to $\overline{a_4}$ which are complementary to the selection signals $a_l$ to $a_4$, respectively.

The N-channel transistors $Q_{21}$ to are coupled between the center portions $N_1$ to $N_4$ of the word lines $WL_{11}$ to $WL_{14}$ and the reference voltage Vss, respectively. The N-channel transistors $Q_{21}$ to $Q_{24}$ are controlled by the signals $\overline{a_l}$ to $\overline{a_4}$, respectively. As explained in connection with FIG. 1, the selection signals a to $a_4$ and their complementary signals $\overline{a_l}$ to $\overline{a_4}$ are the decoded signals of 2-bits of row address signals other than $A_l$–$A_k$ and one of $a_l$ to $a_4$ is made the selective ("1") level. The structure of other groups 10-2 to 10-n is the same as the group 10-1.

Figure 3:
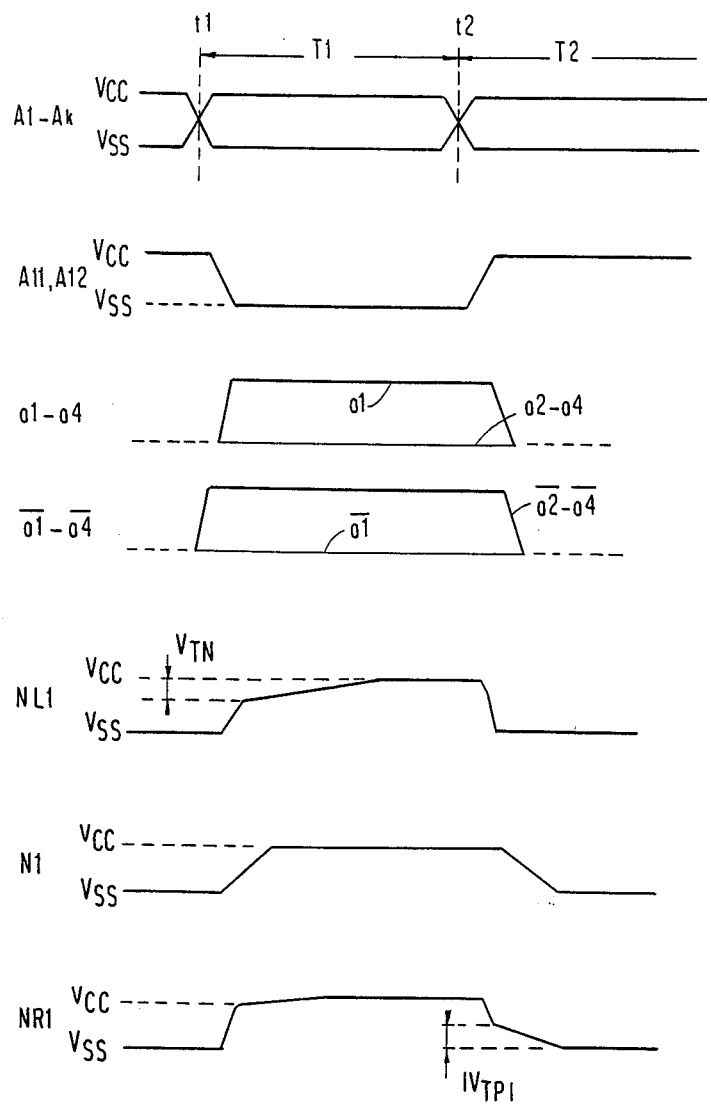
FIG. 3 is a timing diagram showing operations of the memory device of FIG. 2.

With reference to FIG. 3, the operation of the memory of FIG. 2 will be explained.

At a time point $t_l$, a new access cycle $(T_l)$ is initiated and a new state of row address signals $A_l$–$A_k$ are received Then, one of the left-side NAND gates and one of the right side NAND gates associated with the same word line group produce the "0" (low) level outputs. For example, when the word line $WL_{11}$ is to be selected, the outputs $A_{11}$ and $A_{12}$ of the NAND gate $NA_l$ and $NA_l'$ are at the "0" level while the outputs of other NAND gates are at the "1" level.

Also, one of the selection signals, in this case $a_l$ is selected and made at the "1" level with other signals $a_2$–$a_4$ of the "0" level Therefore, the complementary signal $\overline{a_l}$ and $\overline{a_2}$ to $\overline{a_4}$ are at the "0" level and "1" level, respectively.

As a result, the N-channel transistor $Q_{11}$ and the P-channel transistor $Q_{31}$ are both conductive so that the "1" level outputs of the inverters $I_l$ and $I_l'$ are transmitted to the left and right ends of the word line $WL_{11}$ via $Q_{11}$ and $Q_{31}$, respectively.

Since, the left end $NL_l$ of the word line $WL_{11}$ is driven via the N-channel transistor $Q_{11}$, the left end $NL_l$ is first raised to the voltage of "Vcc−$V_{TN}$" ($V_{TN}$ being a threshold voltage of the N channel transistor $Q_{11}$) while the right end $NR_1$ of the word line $WL_{11}$ is immediately raised to the Vcc level via the P-channel transistor $Q_{31}$. Then, after a transmission delay of the Vcc level from $NR_l$ to the center portion $N_l$ and further to the left end $NL_l$, the potentials of the center portion $N_1$ and the left end $NL_1$ are raised to the Vcc level. In this instance, the non-selected word lines $WL_{12}$–$WL_{14}$ are clamped to the Vss level via the transistors $Q_{22}$ to $Q_{24}$ which are rendered conductive in response to the "1" level of $\overline{a_2}$ to $\overline{a_4}$ Then, at a time point $t_2$, the cycle $T_1$ is terminated and the selection of the word line $WL_{11}$ is also terminated. Therefore, the outputs $A_{11}$ and of the NAND gates $NA_l$ and $NA_2$ are changed to the "1" level.

In this instance, the selection signal $a_1$ remains at the "1" level for a short period Thus, the Vcc level of the word line $WL_{11}$ is discharged to the "0" level outputs of the inverters $I_l$ and $I_l'$ via the transistors and $Q_{31}$. The level of the right end $NR_l$ is once fallen to the level of "Vss+$|V_{TP}|$" ($V_{TP}$ being a threshold voltage of the P-channel transisto $Q_{31}$) while the left end $NL_l$ is immediately fallen to the Vss level via the transisto $Q_{11}$. Then, the center portion and the right end $NR_1$ of the word line $WL_{11}$ are gradually fallen to the Vss level Since the clamp transistors to $Q_{21}$ $Q_{24}$ are coupled to the center portions of the respective word lines, the word lines are effectively clamped to the Vss level in the case of non-selection.

As has been explained, the selected word line is driven to the selective level from its both ends via the N-channel transistor and the P-channel transistor Therefore, the selected word line can be raised to the Vcc level without level reduction at a high speed upon selection thereof and fallen to the Vss level at a high speed upon non-selection Thus, a high speed drive of the word line can be achieved.

I claim:

1. A semiconductor memory device comprising at least one group of word lines arranged in parallel; memory cells coupled to said word lines; at least one pair of decoding units for generating the same level of output signals at their output terminals simultaneously; a plurality of first field effect transistors of N-channel type coupled between one ends of said group of word lines and the output terminal of one of said pair of decoding units; a plurality of second field effect transistors of P-channel type coupled between second ends of said group of word lines and the output terminal of the other of said pair of decoding units; first control means for selectively rendering one of said first transistors conductive; and second control means for selectively rendering one of said second transistors conductive, said one second transistor being connected to the word line which is coupled to said one first transistor rendered conductive by said first control means.

2. The memory device according to claim 1, in which each of said memory cells includes a floating gate type field effect transistor.

3. The memory device according to claim 1, further comprising a plurality of third field transistors coupled between said group of word lines and a reference voltage source; and third control means for making conductive those of said third transistors coupled to the word lines which are coupled to the non-conductive first and second transistors.

4. A semiconductor memory device comprising a plurality of memory cells arranged rows and columns; a plurality of word line groups, each of said word line groups having a plurality of word lines arranged in rows; a plurality of pairs of firs and second decoding units provided for said plurality of word line groups, the first and second decoding units in each pair operatively producing the same logic level of output signals; a plurality of first transistors each provided for each of said word lines, each of said first transistors including a N-channel field effect transistor coupled between an output terminal of the first decoding unit of the associated pair and a first end of the associated word line; a plurality of second transistors each provided for said plurality of word lines, each of said second transistors including an P-channel field effect transistor coupled between an output terminal of the second decoding unit of the associated pair and a second end of the associated word line; first control means for selectively making one of said N-channel field effect transistors conductive in the respective word line groups; and second control means for selectively making one of said P-channel field effect transistors conductive in the respective word line group, the conductive N-channel transistor and the conductive P-channel transistor being coupled to the same word line of the associated word line group.

5. The memory device according to claim 4, in which said first and second decoding units receive a first part of row address signals and said first and second control means receive a second part of the row address signals.

6. The memory device according to claim 4, in which each of said memory cells includes a floating gate type field effect transistor.

7. The memory device according to claim 4, further comprising a plurality of third field effect transistors coupled between the word lines and a reference voltage source; and third control means for enabling the third transistors other than the third transistor coupled to the word lines connected to the conductive P and N channel transistors.

8. The memory device according to claim 4, in which the first decoding unit and the second decoding unit in the same pair have NAND gates receiving the same combination of row address signals.

* * * * *

UNITED STATES PATENT AND TRADEMARK OFFICE
CERTIFICATE OF CORRECTION

PATENT NO. : 4,868,788
DATED : September 19, 1989
INVENTOR(S) : Toshikatsu Jinbo It is certified that error appears in the above-identified patent and that said Letters Patent is hereby corrected as shown below:

Column 3, line 29, delete "-$NA_h$" and insert --$NA_n$--.

Column 3, line 59, delete "a", and insert --$a_1$--.

Column 4, line 34, after "$A_{11}$ and", insert --$A_{12}$--.

Column 4, line 39, after "transistors", insert --$Q_{11}$--.

Column 4, line 46, after "transistors", delete "to".

Column 5, line 23, delete "firs", and insert --first--.

Signed and Sealed this

Twenty-fifth Day of December, 1990

Attest:

HARRY F. MANBECK, JR.

*Attesting Officer*     *Commissioner of Patents and Trademarks*